(12) United States Patent
Thunemann et al.

(10) Patent No.: US 12,340,218 B2
(45) Date of Patent: Jun. 24, 2025

(54) DETECTION OF HIGH CURVATURE REGIONS ON CURVES

(71) Applicant: The Boeing Company, Arlington, VA (US)

(72) Inventors: Paul Zack Thunemann, Seattle, WA (US); Thomas Allen Hogan-Schmidt, Seattle, WA (US); Jeffrey David Poskin, Black Diamond, WA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 18/313,221

(22) Filed: May 5, 2023

(65) Prior Publication Data

US 2024/0370259 A1    Nov. 7, 2024

(51) Int. Cl.
*G06F 9/30* (2018.01)

(52) U.S. Cl.
CPC .................. *G06F 9/3001* (2013.01)

(58) Field of Classification Search
CPC .................................... G06F 9/3001
See application file for complete search history.

(56) References Cited

U.S. PATENT DOCUMENTS

| | | | |
|---|---|---|---|
| 2015/0153735 A1* | 6/2015 | Clarke | G08G 1/09623 701/301 |
| 2019/0311805 A1* | 10/2019 | Linguraru | G06T 7/155 |
| 2022/0250765 A1 | 8/2022 | Vance et al. | |
| 2024/0001961 A1* | 1/2024 | Myung | B60W 60/0015 |

OTHER PUBLICATIONS

European Patent Office, Extended European Search Report Issued in Application No. 24174221.2, Dec. 10, 2024, 15 pages.
Lu, L. et al., "High-quality point sampling for B-spline fitting of parametric curves with feature recognition," Journal of Computational and Applied Mathematics, vol. 345, Jan. 1, 2019, 21 pages.
Rasche, C., "An Approach to the Parameterization of Structure for Fast Categorization," International Journal of Computer Vision, vol. 87, No. 3, Aug. 11, 2009, 20 pages.
Daniels, J. et al., "Spline-based feature curves from point-sampled geometry," The Visual Computer, vol. 24, No. 6, Apr. 25, 2008, 14 pages.
Al-Thelaya, K. et al., "InShaDe: Invariant Shape Descriptors for visual 2D and 3D cellular and nuclear shape analysis and classification," Computers & Graphics, vol. 98, May 7, 2021, 21 pages.
European Patent Office, Partial European Search Report Issued in Application No. 24174221.2, Sep. 19, 2024, Germany, 18 pages.

* cited by examiner

*Primary Examiner* — Zachary K Huson
(74) *Attorney, Agent, or Firm* — Alleman Hall & Tuttle LLP

(57) ABSTRACT

A method is provided for detecting regions of high curvature on a curve. The method comprises receiving a curve function and automatically arc length parameterizing the curve function. The local average curvature over the arc length parameterized curve function is automatically computed. One or more regions where the local average curvature turns at least a predetermined angle over a given interval are automatically indicated. The indicated regions are then output.

20 Claims, 9 Drawing Sheets

DETECTION OF HIGH CURVATURE REGIONS ON CURVES

FIELD

The field of the present disclosure relates generally to systems and methods of analyzing two-dimensional curves and three-dimensional (3D) models of object surfaces, and more specifically, to detecting features of such geometries.

BACKGROUND

Many analysis codes rely on single-cell representations of complex parts, such as tensor product B-spline functions. However, computer-aided design (CAD), computer-aided manufacturing (CAM), computer-aided engineering (CAE), and other detailed design tools break surfaces into numerous pieces or sheets which are digitally stitched together like a quilt.

The process of reconstructing a multi-sheet model into a single-cell surface is computationally expensive. If a CAD model is only stored as a multi-piece design, recurring costs may be incurred to take the multi-piece model and refit a single surface so for each analysis that is to be performed.

For example, once a single-cell model is derived, it may be desirable to determine the quality of any curves of the model, to identify the boundaries of the part, the sides and/or corners of the part, and/or other curvature-based features, such as areas of sudden or rapid curvature.

SUMMARY

In view of the above, a method is provided for detecting regions of high curvature on a curve. The method comprises receiving a curve function and automatically arc length parameterizing the curve function. The local average curvature over the arc length parameterized curve function is automatically computed. One or more regions where the local average curvature turns at least a predetermined angle over a given interval are automatically indicated. The indicated regions are then output.

The features, functions, and advantages that have been discussed can be achieved independently in various embodiments or can be combined in yet other embodiments further details of which can be seen with reference to the following description and drawings.

DETAILED DESCRIPTION

Complex objects and surfaces may be stored as a plurality of segments that can individually be described with reasonably simple mathematical descriptors. Increasing the size and complexity of the segment may increase such complexity, thereby occupying more storage space for the same object.

Figure 1:
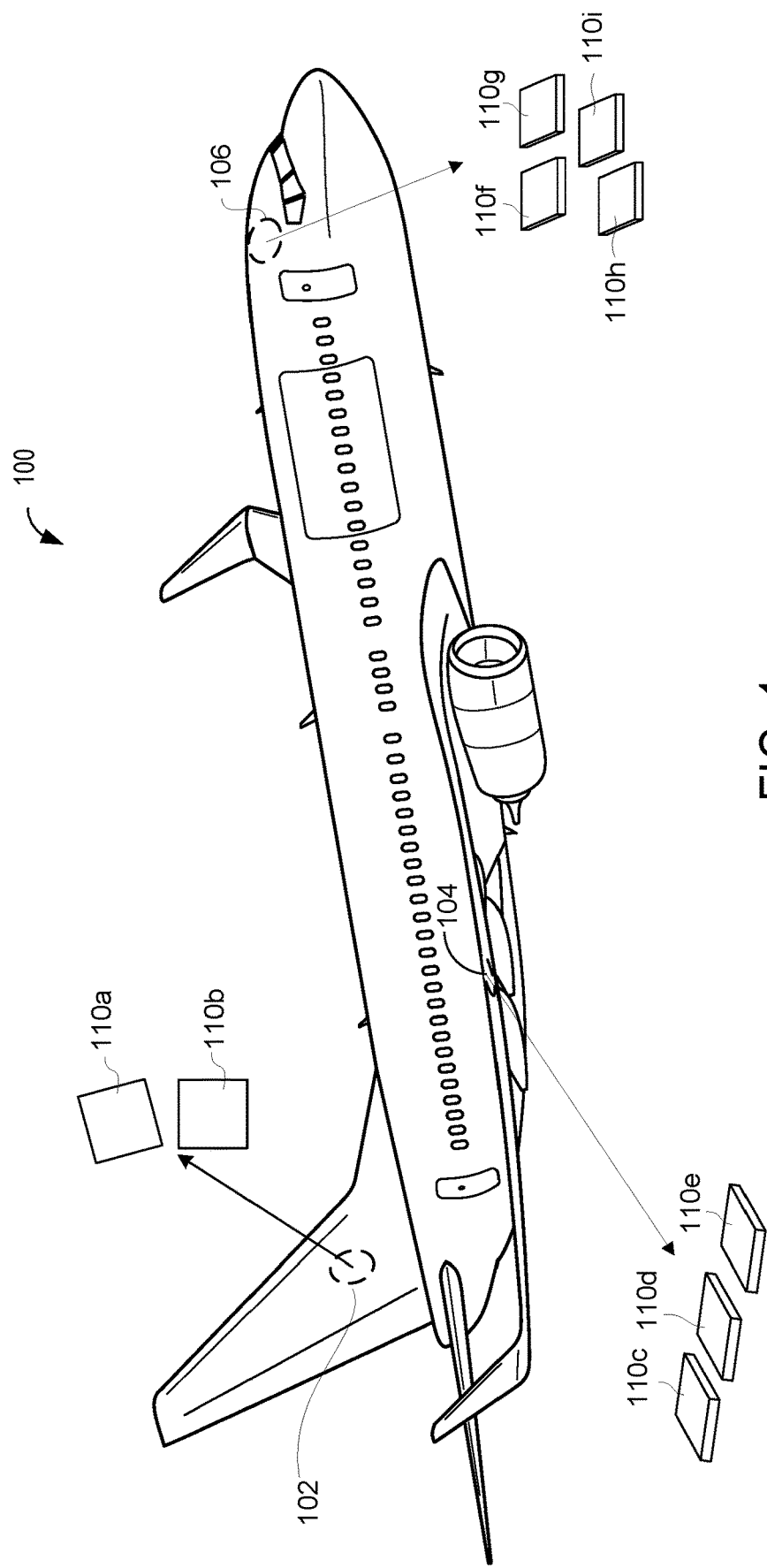
FIG. 1 depicts a three-dimensional model in the form of an aircraft that may be segmented into a number of different sheets.

FIG. 1 depicts a three-dimensional model in the form of an aircraft model 100, according to some embodiments. A three-dimensional computer model for aircraft model 100 can be segmented into a number of different portions, referred to herein as sheets. In typical examples, the sheets are discrete in the sense that they are non-coextensive relative to specific discrete components of the three-dimensional model. For example, the sheets may be relatively small square or rectangular pieces that are not recognizable as any distinct portion of the three-dimensional model. For example, a fairing of aircraft model 100 may be broken up into hundreds of sheets or more, none of which would be recognizable as a fairing.

Aircraft model 100 has a rudder region 102 which is part of the aircraft rudder, a wing region 104 which is part of the right wing of the aircraft, and a canopy region 106 which is part of the canopy covering the cockpit. The regions are decomposed into sheets 110. In particular, two exemplary sheets 110a and 110b are shown for rudder region 102; three exemplary sheets 110c, 110d, and 110e are shown for wing region 104; and four exemplary sheets 110f, 110g, 110h, and 110i are shown for canopy region 106.

While humans are generally quite good at visually identifying the corners of a part, computer algorithms struggle with this task. As such, human intervention or guidance may be needed during analysis. As designers add more and more details to models, e.g., for stress and structural analysis, automated analysis of curvature features, with little or no human input, becomes more and more challenging.

Numerous approaches to solving this problem have been attempted, all with drawbacks. In one example, a boundary can be defined as a plurality of curves, or as a spline comprising a plurality of knots. For each knot, the derivative immediately before and after the knot can be compared for any sudden changes. However, this approach will miss features that can occur in between knots or that only present themselves across several knots.

In another example, the model can be flattened from 3D to 2D, then the resulting surface discretized at a large number of points. However, as the part has to be flattened first, human guidance is required to select the flattening algorithm, and thus this process is not conducive to automation. Further, some models are not feasible to flatten.

Herein, a more robust process is presented for detecting the features on the boundary of a part without a person in the loop to guide the algorithm. A curve for a model is arc length parameterized. By arc length parametrize the curve and scaling the domain to be the length of the curve, Spline Math can be used to compute curvature. The curvature can then be convolved to generate curvature averages along the boundary curves. The dot product of this averaged curvature with itself yields a univariate function that can be employed to detect and identify the location of features on the curve.

Such features may include intervals where the curve is turning sharply, and corners or other such detecting points of maximal locally-averaged curvature. While generally described in the context of curves derived from single cell surfaces of 3D models, the systems and methods described herein may be applied broadly to the analysis of curves from any source.

Figure 2:
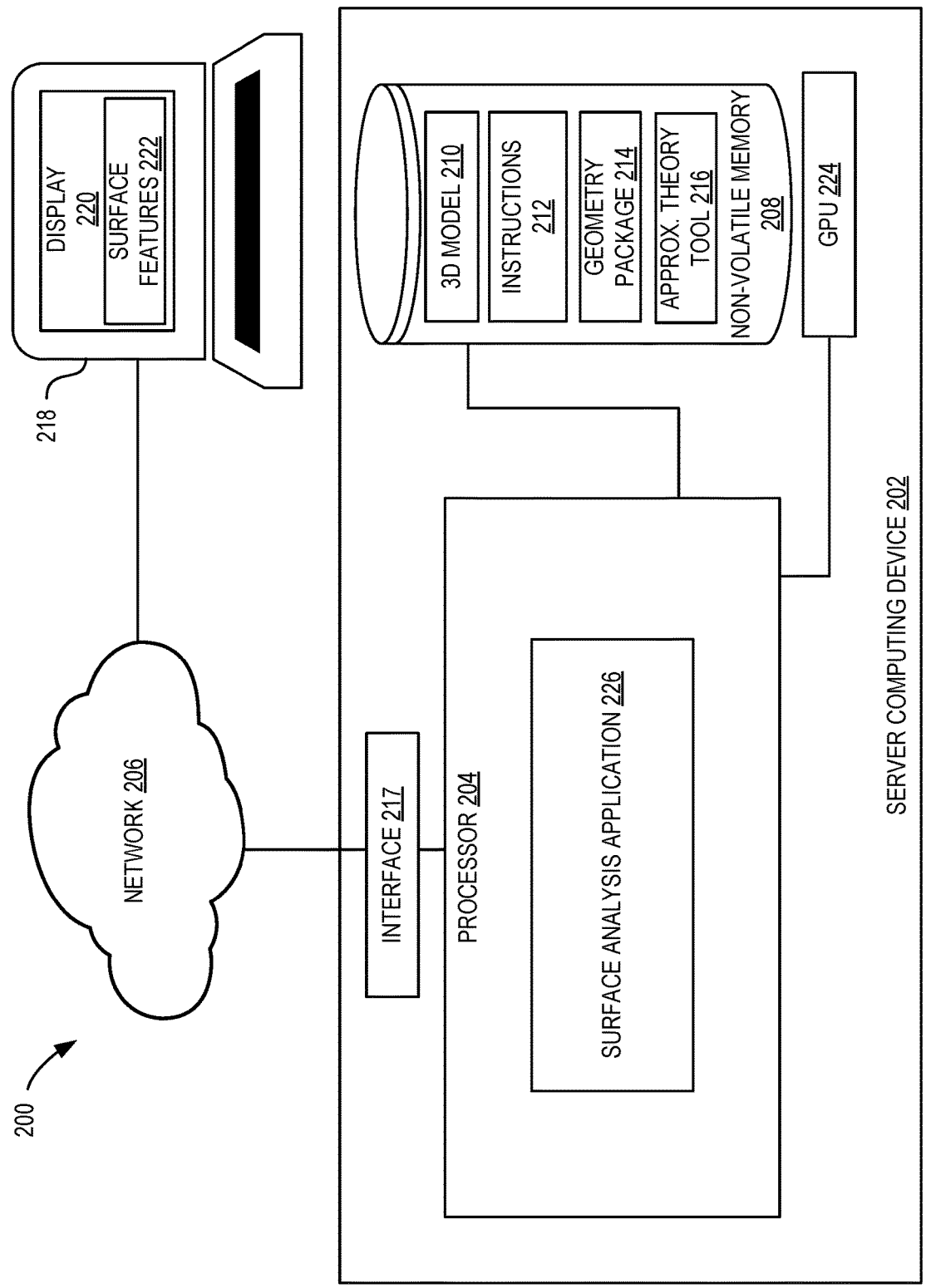
FIG. 2 is a general schematic diagram illustrating an overview of a surface analysis system according to an example of the subject disclosure.

In view of the above issues, as shown in FIG. 2, a schematic diagram of a surface analysis system 200 is depicted, comprising a server computing device 202 which includes one or more processors 204, which can be communicatively coupled to a network 206. The server computing device 202 further comprises non-volatile memory 208 storing a three-dimensional (3D) virtual model 210 and instructions 212 that, when executed by the processor 204, cause the processor 204 to retrieve the 3D virtual model 210 from the non-volatile memory 208. The 3D virtual model 210 can be of an aircraft or an aircraft component, or other manufactured parts or components, for example, as illustrated in FIG. 1. The sizes of the 3D virtual model 210 are not particularly limited—the 3D virtual model 210 can be of micron-scale objects in such applications as printed circuit boards or medical devices, or of over-sized objects.

The 3D virtual model 210 is a mathematical representation of the surface geometry of an object, so that computer-rendered images of the object can be created from any angle. The 3D virtual model 210 can be a polygon mesh model that includes one or more object surfaces. In some examples, 3D virtual model 210 includes a plurality of sub-models and object portions, of which two or more adjacent sub-models or object portions may be combined into a single, continuous model with contiguous object surfaces.

Geometry package 214 that can approximate or represent geometrical surfaces as functions. For example, for each parameterized curve of 3D virtual model 210, an input value in parameter space (t) may be provided, and geometry package 214 may return a position in (x,y,z) space where (t) lies on the curve (e.g., a spline). In some examples, geometry package 214 may be employed so that one or more feature curves of the 3D virtual model 210 can be projected to produce a plurality of two-dimensional curves (U-V curves). The U-V mapping is a parameterized surface and can be a piecewise polynomial mapping, such as a tensor product spline, between a two-dimensional rectangular parameter domain and three-dimensional space.

Approximation theory tool 216 may represent curves of 3D virtual model as parametric curves. Approximation theory tool 216 may include CAD packages and/or other tools with similar functions. Additional mathematical libraries and packages may be included in approximation theory tool 216, and employed to extract the boundary pieces from faces of object surfaces, represent those boundary pieces as parametric curves, and to join the set of parametric curves as a single parametric curve.

The server computing device 202 includes a network interface 217 to affect the communicative coupling to the network 206 and, through the network 206, a client computing device 218. The client computing device 218 comprises a display 220 which is configured to display surface features 222 and other graphical analysis of object surfaces which are output by the server computing device 202. Network interface 217 can include a physical network interface, such as a network adapter.

The server computing device 202 can be a special-purpose computer, adapted for reliability and high-bandwidth communications. Thus, the system 200 can be embodied in a cluster of individual hardware server computers, for example. The processor 204 can be multi-core processors suitable for handling large amounts of information. The processor 204 is communicatively coupled to non-volatile memory 208 storing a 3D virtual model 210 including one or more object surfaces, geometry package 214, approximation theory tool 216, and instructions 212 which can be executed by the processor 204 to effectuate the techniques disclosed herein on concert with the client computing device 218 as shown and described below. The non-volatile memory 208 can be in a Redundant Array of Inexpensive Disk drives (RAID) configuration for added reliability. The processor 204 can also be communicatively coupled to graphical co-processors (GPU) 224. Graphical co-processors 224 can expedite the technique disclosed herein by performing operations in parallel.

The processor 204 is configured to execute a surface analysis application 226. The surface analysis application 226 is configured to receive a curve function defining a portion of an object surface retrieved from a 3D virtual model 210 of an object from the non-volatile memory 208, arc length parameterize the curve function, compute local average curvature over the arc length parameterized curve function, indicate one or more regions where the local average curvature turns at least a predetermined angle over a given interval in parameter space. The surface analysis application 226 is further configured to parameterize the curve function to a single variable, convolving a derivative of the curve function to obtain a first convolution, convolve the first convolution to obtain a second convolution, and to indicate a predetermined number of points of the second convolution having maximal values. Surface analysis application 226 is further configured to output the predetermined number of points and/or indicated regions as surface features 222.

As described, while complex objects and surfaces are stored as a plurality of segments, these segments may need to be merged together into larger, more complex object surfaces to allow for analysis of larger portions of the object. Determining corners and boundaries of a complex, three-dimensional object surface is one aspect that design engineers may consider.

In order to make such a determination, the curvature of the parametric curve may be extracted and evaluated. In some examples, regions of the curve function may have brief regions of high curvature that are not necessarily indicative of a corner or boundary. Rather, the curve may maintain a general trajectory following a modest feature. As such, it may be beneficial to average out the curvature over a given distance to point to true regions of high curvature. As a mathematical quantity, curvature is instantaneous at a specific point on the curve. Here, the regions of interest are characterized by change over a predetermined interval. As such, integration or convolution may be applied to evaluate curvature over a distance, to determine where the curve function is truly turning with a significant trajectory. The fundamental query is thus determining whether the curve turns with a certain angle over a certain length, without regard for any predetermined number of corners or boundaries.

Figure 3:
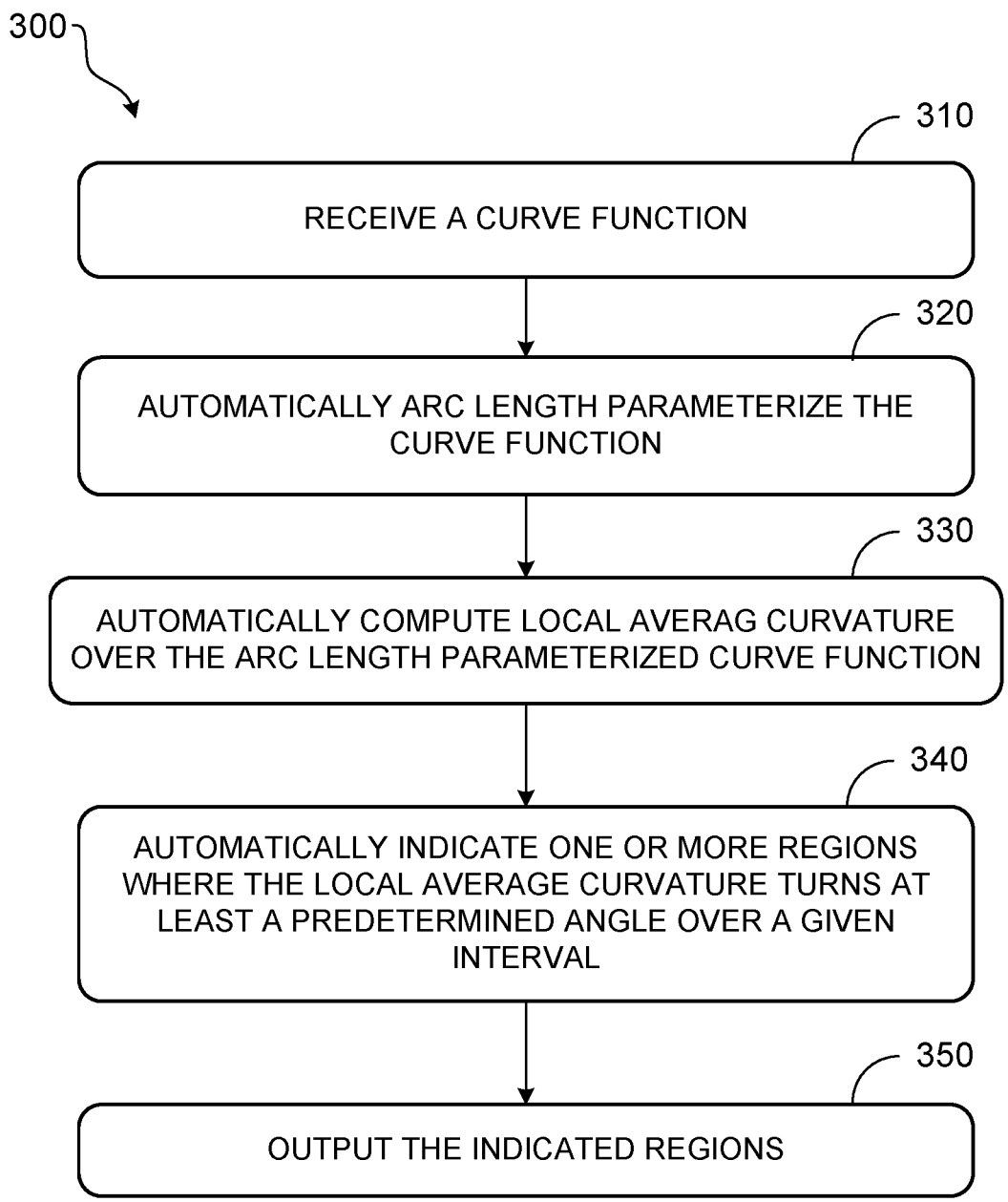
FIG. 3 is a flow chart of a method for detecting regions of high curvature on an object surface according to an example of the subject disclosure.

As an example, FIG. 3 shows a flow chart for a method 300 for detecting regions of high curvature on a curve. Method 300 may be executed by one or more computing devices, such as processor 204 implementing one or more analysis applications, such as surface analysis application 226. In some examples, curve functions may define at least a portion of an object surface. Object surface data corresponding to a 3D virtual model may be retrieved from a network-linked repository, such as non-volatile memory 208, storing 3D virtual models 210.

Figure 4:
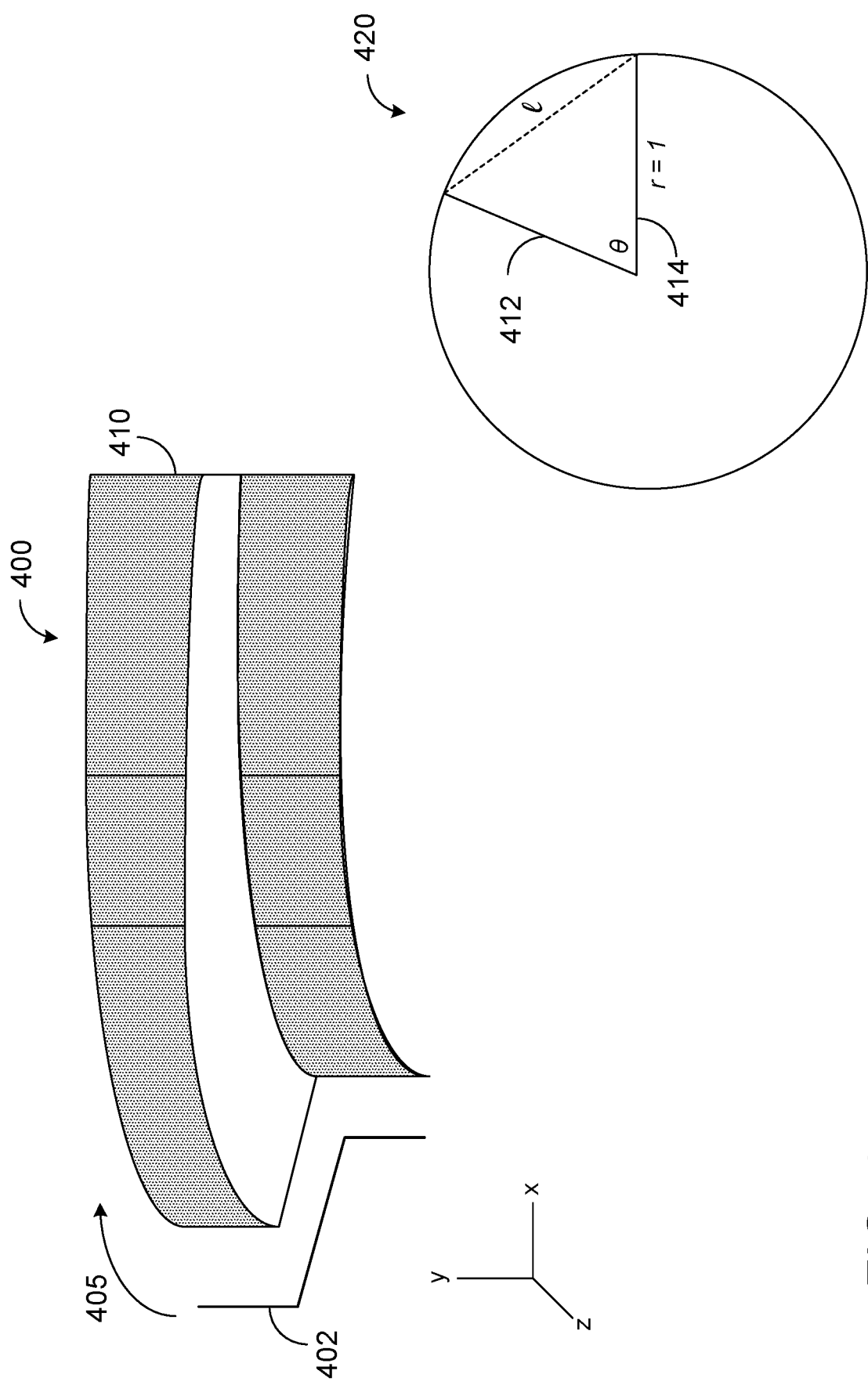
FIG. 4 illustrates an object surface and a pair of 3D vectors positioned on a unit circle.

At 310, method 300 includes receiving a curve function. In some examples, the curve function may be extracted from one or more object surfaces. For examples, the curve function may be a single curve function derived from two or more boundaries extracted from adjacent pieces of the object surface. In some examples, a 3D curve function may be projected into a 1D function by convolving the second derivative of the 3D curve function, and then by taking a dot product. As an example, FIG. 4 shows an example object surface 400. Object surface 400 may be a translation of a 2D curve function 402, as shown at 405. Object surface 400 includes an outer boundary 410, extending around the outside of object surface 400. Outer boundary 410 may be considered a group of edges of a plurality of object sheets that have been joined together.

Returning to FIG. 3, at 320, method 300 includes automatically arc length parameterizing the curve function. For example, the curve function for object surface 400 may be parameterized to be the same as outer boundary 410. In this way, any point on the resultant function may be mapped to a point on object surface 400.

Generally, automatically arc length parameterizing the curve function results in the arc length parameterized curve function having constant speed. For example, using an approximation theory tool (e.g., MATLAB), a curve function such as a spline can be represented as a parametric curve. Such a parametric curve may be arc-length parameterized by any suitable means. The parametric speed of the curve may be set such that movement over a fixed distance in parameter space yields movement of a fixed distance along the curve in physical space. For example, the arc length parameterized curve function may have a constant parametric speed of 1.

As an example, in order to find any and all intervals where the curve $f:\looparrowright \Re^3$, is turning a given angle $\theta$ in less than or equal to a given length L, a new curve may be computed such that $c:\looparrowright \Re^3$ which is an approximation of f but is arc length parameterized. To simplify this notation, let $$w = \frac{L}{2}.$$

To find specific solutions for a desired value of $\theta$, this problem may be illustrated by drawing the vectors c'(s+w) (412) and c'(s−w) (414) in the plane defined by the two 3D vectors, and we note that $\|c'\|\approx 1 \forall \sigma$ so the two vectors lie on the unit circle. This is shown at 420 in FIG. 4.

Based on this vector notation, it follows that solutions for $\theta$ will satisfy Equation 1.

$$\|c'(s+w) - c'(s-w)\| = \ell \quad \text{(Eq. 1)}$$

Trigonometry may then be applied to Equation 1 to express solutions in terms of the cosine of $\theta$.

$$2 \sin\frac{\theta}{2} = \ell \quad \text{(Eq. 2)}$$

$$\left\|c'(s+\ell/2) - c'\left(s - \frac{\ell}{2}\right)\right\| = 2 \sin\frac{\theta}{2}$$

-continued
$$c'(s+w)^2 - 2\, c'(s+w)c'(s-w) + c'(s-w)^2 =$$

$$4 \sin^2\frac{\theta}{2} = 4\frac{1-\cos\theta}{2} = 2 - 2\cos\theta$$

$$1 - 2\, c'(s+w)c'(s-w) + 1 = 2 - 2\cos\theta$$

$$c'(s-w) \cdot c'(s+w) = \cos\theta$$

As shown below, such an equation may be solved using Spline math. Using a mathematical library suitable to operating on arrays, the arc length parametric curve may be subject to mathematical operations, such as derivatives, dot products, linear adjustments, hat functions, convolutions, etc.

For example, at 330, method 300 includes automatically computing local average curvature over the arc length parameterized curve function. The formula for curvature is given by Equation 3.

$$\kappa = \frac{\|f' \times f\|}{\|f'\|^3} \quad \text{(Eq. 3)}$$

As the function has been reparametrized, a simpler equation may be expressed.

$$\kappa = c'' \quad \text{(Eq. 4)}$$

Local average curvature may be determined at least by integrating over a region around s.

$$\int_{s-w}^{s+w} c''(\sigma)d\sigma = \frac{c'(s+w) - c'(s-w)}{2w} \quad \text{(Eq. 5)}$$

In some examples, automatically computing the local average curvature over the arc length parameterized curve function may comprise at least taking a dot product of the arc length parameterized curve function with itself.

At 340, method 300 includes automatically indicating one or more regions where the local average curvature turns at least a predetermined angle over a given interval. For example, the given interval may be in parameter space. Such a parameter space interval may correlate with a distance along the curve in model space. In some examples, automatically indicating one or more regions where the local average curvature turns at least a predetermined angle $\theta$ over a given interval L in parameter space comprises automatically identifying points where the arc length parameterized curve turns at the predetermined angle.

Identifying such points may comprise generating solutions to the resulting function using a root finding solver. In this example, the curve function does not need to be convolved or integrated, as the goal is to determine where the derivative of the curve function has turned a certain number of degrees over a given interval. For example, an equation of one variable (s) may be solved where c is the curve. The derivative may be taken at s−w and at s+w. By taking the dot product of those, a univariate equation is yielded. The root finding problem can thus be solved where that dot product is equal to cos $\theta$. Such a problem may be solved via any number of numerical tools, such as the python numerical package or MATLAB.

For example, the root finding solver may derive roots that are equal to the zeros of Equation 6.

$$c'(s-w) \cdot c'(s+w) = \cos\theta \qquad \text{(Eq. 6)}$$

In this example, c' is the derivative of the arc length parameterized curve function, s is an input variable of this function, w is equal to half of the given interval, and θ is the predetermined angle. In some examples, automatically identifying points where the arc length parameterized curve turns at the predetermined angle may comprise automatically determining whether the interval between each neighboring pair of solutions is greater than or less than the given interval. As such, regions, not just points of high curvature may be determined. Such a formulation may be set to output any such points where the curve turns \θ degrees over L inches.

Figure 5:
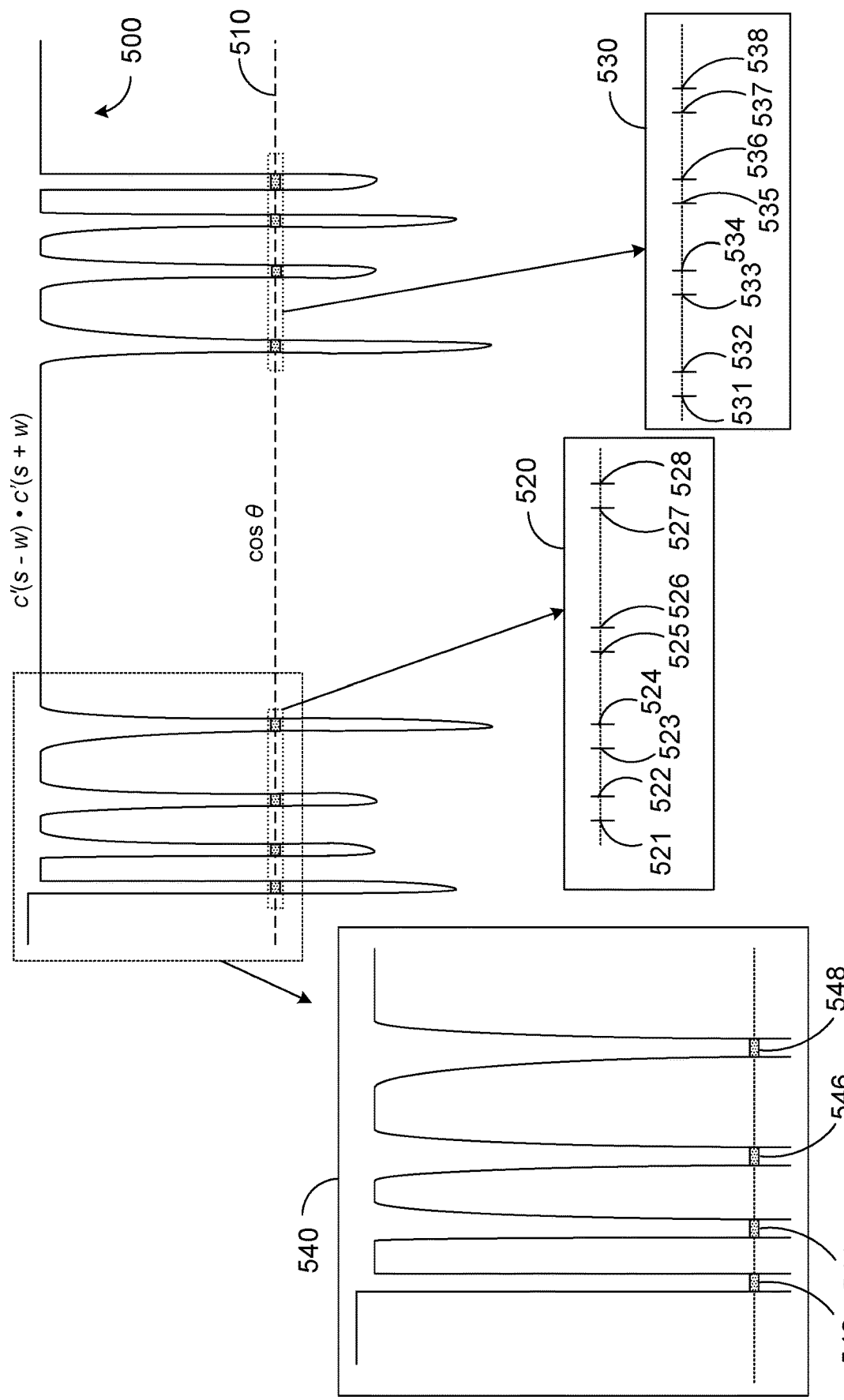
FIG. 5 is an example plot showing curvature for an arc length parameterized curve.

For example, FIG. 5 shows an example plot 500 of Equation 6 representing object surface 400. In this example, C is the function, there are 3 dependent variables (xyz), and only one independent variable (s); w is a constant (half the length of the interval of interest L) in parameter space. Because the curve function has been arc length parameterized to a function with a speed of 1, the interval L is also easily discernible in model space. Taking a dot product results in the dependent variables collapsing to a single output variable that is represented by plot 500, with a single input variable (s). As such, Equation 6 becomes a function with one input and one output.

The solutions, or roots, where the local average curvature turns at least a predetermined angle θ over a given interval L, are where plot 500 is equal to the cosine of the predetermined angle θ (e.g., threshold 510). In practice, this yields a number of pairs of points (e.g., where curve crosses the threshold then crosses back). A more detailed view of a first set of points is shown at 520 (e.g., points 521-522, 523-524, 525-526, and 527-528) and a second set of points is shown in more detail at 530 531-532, 533-534, 535-536, and 537-538). Intervals between these pairs of points are indicated by bars. A more detailed view of a portion of plot 500 that indicates such intervals is shown at 540 (e.g., intervals 542, 544, 546, and 548). A range in parameter space is indicated for each region where the curvature is more than the predetermined θ over interval L. Thus, for each adjacent pair of points, a distance may be determined and compared to the predetermined interval L e.g., whether that interval has higher or lower curvature than the predetermined threshold. The function is parameterized as the boundary. As such, where the function passes cos θ, the boundary starts. While four intervals (542, 544, 546, and 548) are shown, an additional four intervals (e.g., between pairs of points 531-532, 533-534, 535-536, and 537-538) also meet the criteria.

Figure 6:
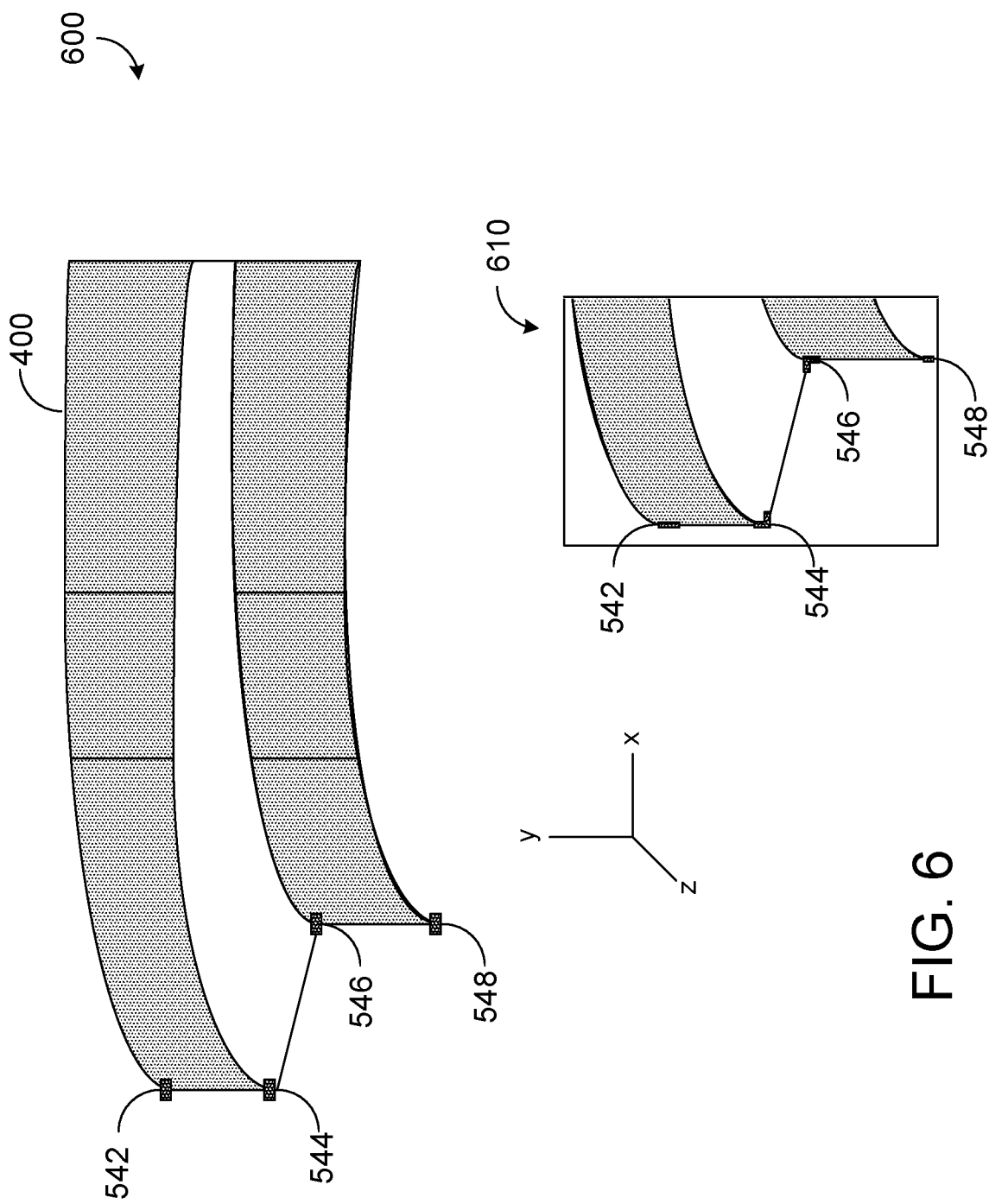
FIG. 6 shows a view of the object surface of FIG. 4 with intervals of high curvature overlaid.

FIG. 6 shows a view 600 of object surface 400 with intervals 542, 544, 546, and 548 overlaid. Inset 610 shows intervals 542, 544, 546, and 548 in greater detail. Returning to FIG. 3, at 350, method 300 comprises outputting the indicated regions.

To detect or determine boundaries of an object surface, the 4 points that have the highest curvature can be identified. Rather than evaluating the raw curve, the initial 3D curve can be converted to a function that is parameterized the same as the initial 3D curve, but features a single variable—e.g., the integrated curvature variable. The highest points of that function can be solved using any suitable approach for finding the critical points of a function. A user desiring four sides to a surface would thus solve for the four points of the function that have the highest values.

Another challenge is to detect the corners of the object surface. In one example, the curve is convolved twice, and then squared. This approach allows for the determination of individual points where the function has the highest values. e.g., where the function is turning the most.

Figure 7:
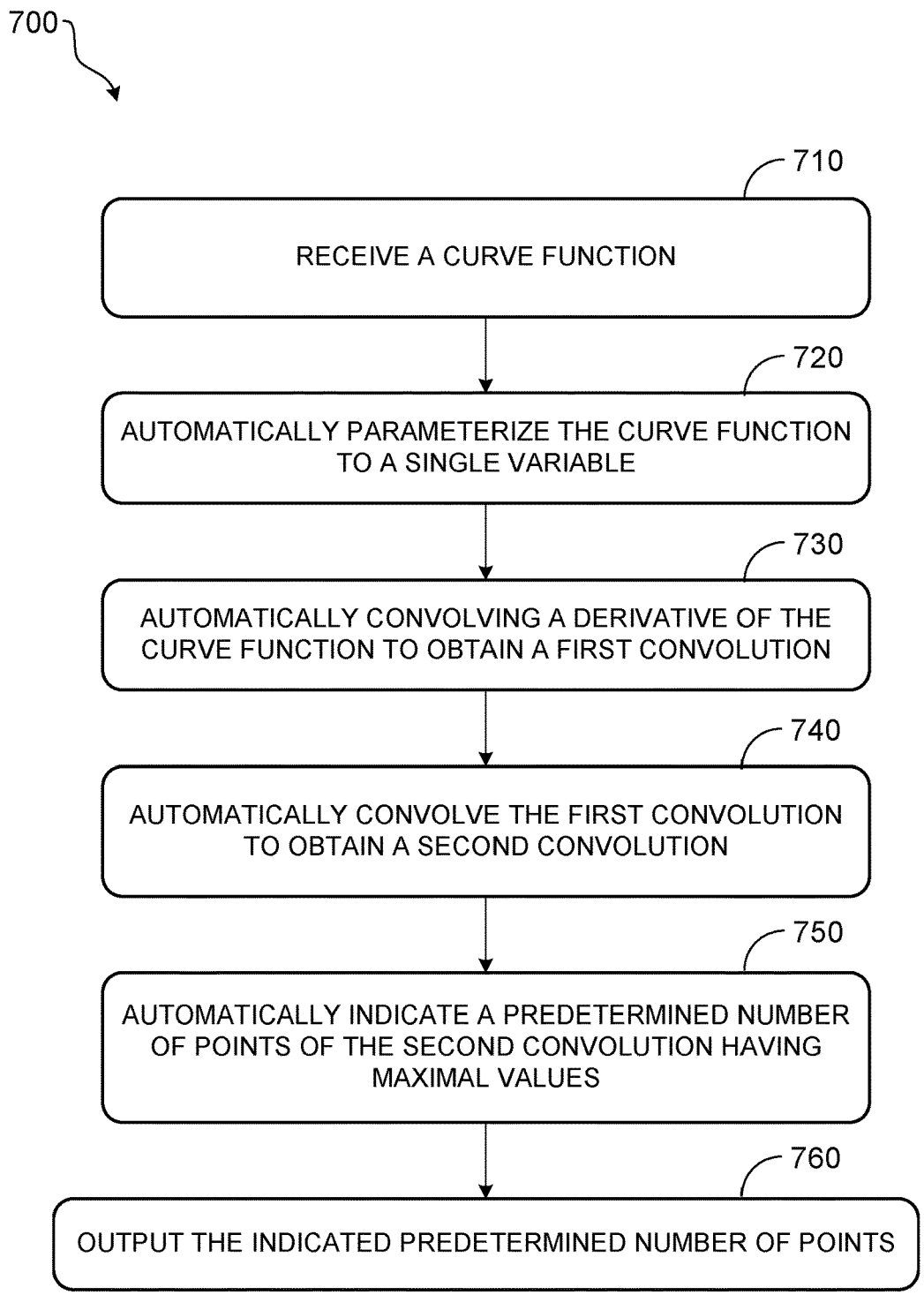
FIG. 7 is a flow chart of a method for detecting regions of maximal average curvature on an object surface according to an example of the subject disclosure.

FIG. 7 shows a flow-diagram for an example method 700 for detecting regions of maximal average curvature on a curve. Method 700 may be carried out by one or more computing devices, such as processor 204 implementing one or more analysis applications such as surface analysis application 226. In some examples, curve functions may define at least a portion of an object surface. Object surface data corresponding to a 3D virtual model may be retrieved from a network-linked repository, such as non-volatile memory 208, storing 3D virtual models 210.

Figure 8:
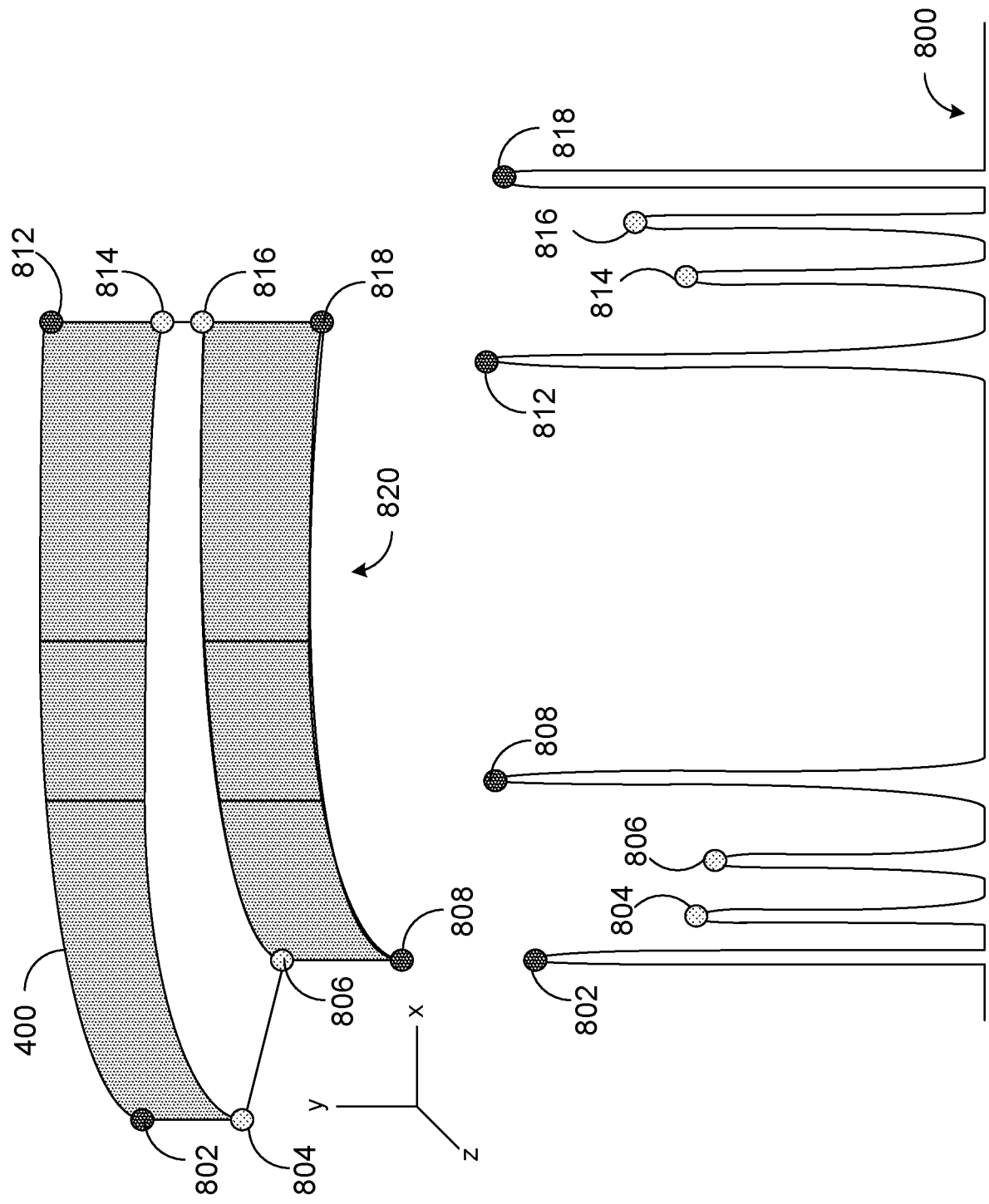
FIG. 8 is an example plot and overlay of maximal average curvature points for the object surface of FIG. 4.

At 710, method 700 comprises receiving a curve function. Such a curve function may define at least a portion of an object surface. For example, the curve function can be represented with one or more splines. In some examples, the curve function is a single curve function derived from two or more boundaries extracted from adjacent pieces of the object surface. For example, FIG. 8 shows another depiction of object surface 400.

In examples wherein the curve function is represented with one or more splines, $C_2$ discontinuities in the curve function may be automatically indicated based on detecting knot multiplicities. In such examples, the $C_2$ discontinuities may be corrected by stitching adjacent splines or spline portions together and generating a single, continuous spline. In some examples, the curve function can be chopped into $C_2$ continuous pieces, followed by checking the change in tangent angles at the discontinuities. However, it may be more effective to preprocess the curve function by convolving the curve function with a hat function. For example, a curve function $f$ may be preprocessed by convolving with a narrow hat function. As a non-limiting example, $\chi_{[-w/100.0, w/100.0]}*f$ is used for preprocessing in some of the calculations shown below.

Returning to FIG. 7, at 720, method 700 comprises automatically parameterizing the curve function to a single variable. For example, the single variable may be an integrated curvature variable. From here, one way to detect corners includes find the maximal average curvature of the parameterized curve function. Maximal average curvature occurs where the derivative of average curvature is zero, as shown in Equation 7.

$$\left(\frac{c''(s+w) - c''(s-w)}{2w}\right)^2 = 0 \qquad \text{(Eq. 7)}$$

However, this calculation tends to be rather flat in the presence of sharp corners. However, by arc length parameterizing the curve function, the parametric speed can be made equal to 1 for the entire curve function. Curvature can thus be set to be the same as the second derivative, and thus convolution can be performed by the $2^{nd}$ derivative. Given a spline, this computation can be performed analytically and robustly.

Accordingly, at 730, method 700 comprises automatically convolving a derivative of the curve function to obtain a first convolution. For examples, the second derivative of the curve function may be convolved. This is shown in Equation 8.

$$\int_{s-w}^{s+w} c''(\sigma)d\sigma = \frac{c'(s+w) - c'(s-w)}{2w} = \left(\frac{\chi_{[-w,w]}}{2w} * c''\right)(s) \quad \text{(Eq. 8)}$$

Although Equation 8 denotes an integral, this could also be represented as a convolution of c″ with the hat function $\chi_{[-w,w]}$. As such, convolution removes the need for large-scale integration of the curve function, thereby simplifying the calculation and reducing the processor load.

At 740, method 700 comprises automatically convolving the first convolution to obtain a second convolution. The flat regions in the first convolution can be resolved by convolving a second time, generating single points near the center of the high average curvature regions. In other words, points where Equation 9 is maximized.

$$\left(\frac{\chi^2_{[-w,w]}}{2w} * c''\right)(s) \quad \text{(Eq. 9)}$$

The second convolution yields a very peak-heavy function that simplifies identifying the points that most resemble corners of the object surface. Any analysis software can easily find any number of peaks as prescribed. An example can be seen in FIG. 8. Plot 800 is an example of Equation 9 as applied to object surface 400. Four points of highest average curvature are shown at 802, 804, 806, and 808. Four additional points of high average curvature are shown at 812, 814, 816, and 818. Any point of high curvature will show as a spike.

Returning to FIG. 7, at 750, method 700 comprises automatically indicating a predetermined number of points of the second convolution having maximal values. For example, the local maxima of the second convolution can be found by solving for all of the roots of Equation 10.

$$\left(\frac{\chi^2_{[-w,w]}}{2w} * c''\right)' \cdot \left(\frac{\chi^2_{[-w,w]}}{2w} * c''\right)' = 0 \quad \text{(Eq. 10)}$$

In some examples, the predetermined number of points of the second convolution having maximal values (e.g., where the first derivative of Eq. 9 is equal to zero) are automatically indicated using a root finding solver for Eq. 10. The predetermined number of points may be input by a user, selected based on characteristics of the curve function, determined by thresholding the second convolution etc. As an example, the indicated predetermined number of points may represent single points near centers of regions of maximal average curvature on the object surface.

In general, once the univariate function is generated, the critical points can be seen with the naked eye. Setting the threshold or number of corners allows the user to determine how they are characterizing the surface. As shown at 820, object surface 400 may be characterized by four critical points or corners (e.g., 802, 808, 812, 818). Four other points of interest (e.g., 804, 806, 814, 816) also show maximal average curvature, and are the points which next most resemble corners. In some examples, the threshold may be applied to a specific region of the univariate function (e.g., to indicate corners of one portion of the object surface).

Returning to FIG. 7, at 760, method 700 comprises outputting the indicated predetermined number of points.

Arc length parameterization allows the curvature of an object surface to be treated as a set of second derivatives. This reduces computational complexity, allowing the curves to be reasoned about in a mathematical library. The systems and methods described herein further have the potential benefits of reducing the need for human interaction and input during the analysis process. The methods described herein enable progress towards a larger goal of seamlessly integrating analysis tools which operate on single-cell geometry with design software that store models as multi-piece designs.

The features output by the systems and processes described herein, including regions of high curvature and points of maximal average curvature can be used in various applications. For example, the regions of high curvature and points of maximal average curvature can be used in additive manufacturing applications, for example, to optimize the weight, cost, and/or function of a 3D manufactured object through 3D model modifications. The regions of high curvature and points of maximal average curvature can also be used to more accurately characterize the geometry of a part of surface. For example, unexpected, short-distance regions of high angle curvature may be revealed. The surface analysis software can then be programmed to excise those portions, and stitch in a smoother, or less angular, portion into the model. The processes described herein may further be used to generate indications of curve quality. For examples, object surfaces can be inspected to ensure they have sufficient smoothness for their intended purpose.

It will be appreciated that the surface of aircraft model 100 or a component thereof, such as wing region 104, can be the object surface that is used for detecting regions of high curvature and/or maximal average curvature by the 3D virtual model 210 in accordance with the system 200 and methods 300 and 700 of the subject disclosure. However, system 200 and methods 300 and 700 can be useful for any application that analyzes surfaces of geometric parts and encounters scenarios where there is utility in reasoning about where corners and sharp turns are located on the boundary of such surfaces.

Figure 9:
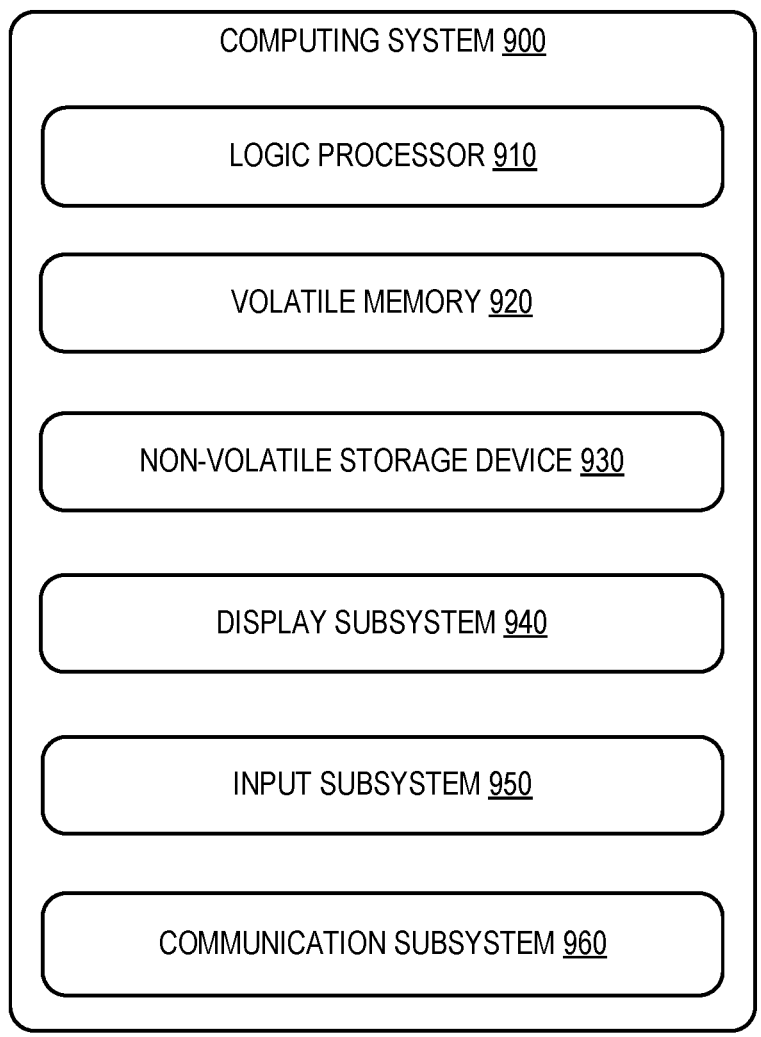
FIG. 9 is a schematic diagram illustrating an exemplary computing system that can be used to implement the surface analysis system of FIG. 2.

FIG. 9 illustrates an exemplary computing system 900 that can be utilized to implement the system 200 and methods 300 and 700 described above. Computing system 900 includes a logic processor 910, volatile memory 920, and a non-volatile storage device 930. Computing system 900 can optionally include a display subsystem 940, input subsystem 950, communication subsystem 960 connected to a computer network, and/or other components not shown in FIG. 9. These components are typically connected for data exchange by one or more data buses when integrated into single device, or by a combination of data buses, network data interfaces, and computer networks when integrated into separate devices connected by computer networks.

The non-volatile storage device 930 stores various instructions, also referred to as software, which are executed by the logic processor 910. Logic processor 910 includes one or more physical devices configured to execute the instructions. For example, the logic processor 910 can be configured to execute instructions that are part of one or more applications, programs, routines, libraries, objects, components, data structures, or other logical constructs. Such instructions can be implemented to perform a task, implement a data type, transform the state of one or more components, achieve a technical effect, or otherwise arrive at a desired result.

The logic processor 910 can include one or more physical processors (hardware) configured to execute software instructions. Additionally or alternatively, the logic processor 910 can include one or more hardware logic circuits or firmware devices configured to execute hardware-implemented logic or firmware instructions. Processors of the logic processor 910 can be single-core or multi-core, and the instructions executed thereon can be configured for sequential, parallel, and/or distributed processing. Individual components of the logic processor 910 optionally can be distributed among two or more separate devices, which can be remotely located and/or configured for coordinated processing. Aspects of the logic processor 910 can be virtualized and executed by remotely accessible, networked computing devices configured in a cloud-computing configuration. In such a case, these virtualized aspects are run on different physical logic processors of various different machines, it will be understood.

Non-volatile storage device 930 includes one or more physical devices configured to hold instructions executable by the logic processors to implement the methods and processes described herein. When such methods and processes are implemented, the state of non-volatile storage device 930 can be transformed—e.g., to hold different data.

Non-volatile storage device 930 can include physical devices that are removable and/or built-in. Non-volatile storage device 930 can include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 930 can include nonvolatile, dynamic, static, read/write, read-only, sequential-access, location-addressable, file-addressable, and/or content-addressable devices. It will be appreciated that non-volatile storage device 930 is configured to hold instructions even when power is cut to the non-volatile storage device 930.

Volatile memory 920 can include physical devices that include random access memory. Volatile memory 920 is typically utilized by logic processor 910 to temporarily store information during processing of software instructions. It will be appreciated that volatile memory 920 typically does not continue to store instructions when power is cut to the volatile memory 920.

Aspects of logic processor 910, volatile memory 920, and non-volatile storage device 930 can be integrated together into one or more hardware-logic components. Such hardware-logic components can include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" can be used to describe an aspect of the surface analysis system 200 typically implemented in software by a processor to perform a particular function using portions of volatile memory, which function involves transformative processing that specially configures the processor to perform the function. Thus, a module, program, or engine can be instantiated via logic processor 910 executing instructions held by non-volatile storage device 930, using portions of volatile memory 920. It will be understood that different modules, programs, and/or engines can be instantiated from the same application, service, code block, object, library, routine, API, function, etc. Likewise, the same module, program, and/or engine can be instantiated by different applications, services, code blocks, objects, routines, APIs, functions, etc. The terms "module," "program," and "engine" can encompass individual or groups of executable files, data files, libraries, drivers, scripts, database records, etc.

Display subsystem 940 typically includes one or more displays, which can be physically integrated with or remote from a device that houses the logic processor 910. Graphical output of the logic processor executing the instructions described above, such as a graphical user interface, is configured to be displayed on display subsystem 940.

Input subsystem 950 typically includes one or more of a keyboard, pointing device (e.g., mouse, trackpad, finger operated pointer), touchscreen, microphone, and camera. Other input devices can also be provided.

Communication subsystem 960 is configured to communicatively couple various computing devices described herein with each other, and with other devices. Communication subsystem 960 can include wired and/or wireless communication devices compatible with one or more different communication protocols. As non-limiting examples, the communication subsystem can be configured for communication via a wireless telephone network, or a wired or wireless local- or wide-area network by devices such as a 3G, 4G, 5G, or 6G radio, Wi-Fi card, Ethernet network interface card, BLUETOOTH radio, etc. In some embodiments, the communication subsystem can allow computing system 900 to send and/or receive messages to and/or from other devices via a network such as the Internet. It will be appreciated that one or more of the computer networks via which communication subsystem 960 is configured to communicate can include security measures such as user identification and authentication, access control, malware detection, enforced encryption, content filtering, etc., and can be coupled to a wide area network (WAN) such as the Internet.

The subject disclosure includes all novel and non-obvious combinations and subcombinations of the various features and techniques disclosed herein. The various features and techniques disclosed herein are not necessarily required of all examples of the subject disclosure. Furthermore, the various features and techniques disclosed herein can define patentable subject matter apart from the disclosed examples and can find utility in other implementations not expressly disclosed herein.

To the extent that terms "includes," "including," "has," "contains," and variants thereof are used herein, such terms are intended to be inclusive in a manner similar to the term "comprises" as an open transition word without precluding any additional or other elements.

Further, the disclosure comprises configurations according to the following clauses.

Clause 1. A method for detecting regions of high curvature on a curve, comprising receiving a curve function; automatically arc length parameterizing the curve function; automatically computing local average curvature over the arc length parameterized curve function; automatically indicating one or more regions where the local average curvature turns at least a predetermined angle over a given interval; and outputting the indicated regions.

Clause 2. The method of clause 1, wherein automatically arc length parameterizing the curve function results in the arc length parameterized curve function having constant parameterization.

Clause 3. The method of clause 1 or 2, wherein the arc length parameterized curve function has a constant parametric speed of 1.

Clause 4. The method of any of clauses 1-3, wherein the curve function is a single curve function derived from two or more boundaries extracted from adjacent pieces of an object surface.

Clause 5. The method of any of clauses 1-4, wherein automatically computing the local average curvature over the arc length parameterized curve function comprises at least taking a dot product of the arc length parameterized curve function with itself.

Clause 6. The method of any of clauses 1-5, wherein automatically indicating one or more regions where the local average curvature turns at least a predetermined angle over a given interval in parameter space comprises automatically identifying points where the arc length parameterized curve turns at the predetermined angle; and automatically determining whether the interval between each neighboring pair of solutions is greater than or less than the given interval.

Clause 7. The method of any of clauses 1-6, wherein automatically identifying points where the arc length parameterized curve turns at the predetermined angle is performed by a root finding solver.

Clause 8. The method of any of clauses 1-7, wherein the root finding solver derives roots that are equal to the zeros of the equation $c'(s-w) \cdot c'(s+w) = \cos \theta$; wherein $c'$ is the arc length parameterized curve function, $s$ is an input variable, $w$ is equal to half of the given interval, and $\theta$ is the predetermined angle.

Clause 9. A method for detecting regions of maximal average curvature on a curve, comprising receiving a curve function; automatically parameterizing the curve function to a single variable; automatically convolving a derivative of the curve function to obtain a first convolution; automatically convolving the first convolution to obtain a second convolution; automatically indicating a predetermined number of points of the second convolution having maximal values; and outputting the indicated predetermined number of points.

Clause 10. The method of clause 9, wherein the single variable is an integrated curvature variable.

Clause 11. The method of clause 9 or 10, wherein the indicated predetermined number of points represent single points near centers of regions of maximal average curvature on the object surface.

Clause 12. The method of any of clauses 9-11, wherein the predetermined number of points of the second convolution having maximal values are automatically indicated using a root finding solver.

Clause 13. The method of any of clauses 9-12, wherein the curve function is represented with one or more splines.

Clause 14. The method of any of clauses 9-13, wherein the method further comprises automatically indicating discontinuities in the curve function based on detecting knot multiplicities.

Clause 15. The method of any of clauses 9-14, wherein the method further comprises preprocessing the curve function by convolving the curve function with a hat function.

Clause 16. The method of clauses 9-15, wherein the curve function is a single curve function derived from two or more boundaries extracted from adjacent pieces of an object surface.

Clause 17. A surface analysis system comprising at least one processor, communicatively coupled to non-volatile memory storing a three-dimensional (3D) virtual model and instructions that, when executed by the processor, cause the processor to receive a curve function defining a portion of an object surface; automatically arc length parameterize the curve function; automatically compute local average curvature over the arc length parameterized curve function; automatically indicate one or more regions where the local average curvature turns at least a predetermined angle over a given interval in parameter space; and output the indicated regions.

Clause 18. The surface analysis system of clause 17, wherein automatically indicating one or more regions where the local average curvature turns at least a predetermined angle over a given interval in parameter space comprises automatically identifying points where the arc length parameterized curve turns at the predetermined angle; and automatically determining whether the interval between each neighboring pair of solutions is greater than or less than the given interval.

Clause 19. The surface analysis system of clause 17 or 18, wherein the non-volatile memory further stores instructions that, when executed by the processor, cause the processor to receive a curve function defining at least a portion of the object surface; automatically parameterize the curve function to a single variable; automatically convolve a derivative of the curve function to obtain a first convolution; automatically convolve the first convolution to obtain a second convolution; automatically indicate a predetermined number of points of the second convolution having maximal values; and output the indicated predetermined number of points.

Clause 20. The surface analysis system of any of clauses 17-19, wherein the curve function is a single curve function derived from two or more boundaries extracted from adjacent pieces of the object surface.

The invention claimed is:

1. A method for detecting regions of high curvature on a curve, comprising:
   receiving a curve function;
   receiving an indication of a predetermined angle on the curve function;
   automatically arc length parameterizing the curve function;
   automatically computing local average curvature over the arc length parameterized curve function;
   automatically indicating one or more regions where the local average curvature turns at least the predetermined angle over a given interval; and
   outputting the indicated regions.

2. The method of claim 1, wherein automatically arc length parameterizing the curve function results in the arc length parameterized curve function having constant parameterization.

3. The method of claim 2, wherein the arc length parameterized curve function has a constant parametric speed of 1.

4. The method of claim 1, wherein the curve function is a single curve function derived from two or more boundaries extracted from adjacent pieces of an object surface.

5. The method of claim 1, wherein automatically computing the local average curvature over the arc length parameterized curve function comprises at least taking a dot product of the arc length parameterized curve function with itself.

6. The method of claim 1, wherein automatically indicating one or more regions where the local average curvature turns at least the predetermined angle over the given interval in parameter space comprises:
   automatically identifying points where the arc length parameterized curve turns at the predetermined angle; and
   automatically determining whether the interval between each neighboring pair of solutions is greater than or less than the given interval.

7. The method of claim 6, wherein automatically identifying points where the arc length parameterized curve turns at the predetermined angle is performed by a root finding solver.

8. The method of claim 7, wherein the root finding solver derives roots that are equal to zero values of an equation $c'(s-w) \cdot c'(s+w) = \cos \theta$; wherein $c'$ is the arc length parameterized curve function, s is an input variable, w is equal to half of the given interval, and $\theta$ is the predetermined angle.

9. A method for detecting regions of maximal average curvature on a curve, comprising:
receiving a curve function;
receiving a specification of a predetermined number of points on the curve function;
automatically parameterizing the curve function to a single variable;
automatically convolving a derivative of the curve function to obtain a first convolution;
automatically convolving the first convolution to obtain a second convolution;
automatically indicating a predetermined number of points of the second convolution having maximal values; and
outputting the indicated predetermined number of points.

10. The method of claim 9, wherein the single variable is an integrated curvature variable.

11. The method of claim 9, wherein the indicated predetermined number of points represent single points near centers of regions of maximal average curvature on an object surface.

12. The method of claim 9, wherein the predetermined number of points of the second convolution having maximal values are automatically indicated using a root finding solver.

13. The method of claim 9, wherein the curve function is represented with one or more splines.

14. The method of claim 13, further comprising:
automatically indicating discontinuities in the curve function based on detecting knot multiplicities.

15. The method of claim 13, further comprising:
preprocessing the curve function by convolving the curve function with a hat function.

16. The method of claim 13, wherein the curve function is a single curve function derived from two or more boundaries extracted from adjacent pieces of an object surface.

17. A surface analysis system, comprising:
at least one processor, communicatively coupled to non-volatile memory storing a three-dimensional (3D) virtual model and instructions that, when executed by the processor, cause the processor to:
receive a curve function defining a portion of an object surface;
receive an indication of a predetermined angle on the curve function;
automatically arc length parameterize the curve function;
automatically compute local average curvature over the arc length parameterized curve function;
automatically indicate one or more regions where the local average curvature turns at least the predetermined angle over a given interval in parameter space; and
output the indicated regions.

18. The surface analysis system of claim 17, wherein automatically indicating one or more regions where the local average curvature turns at least the predetermined angle over the given interval in parameter space comprises:
automatically identifying points where the arc length parameterized curve turns at the predetermined angle; and
automatically determining whether the interval between each neighboring pair of solutions is greater than or less than the given interval.

19. The surface analysis system of claim 17, wherein the non-volatile memory further stores instructions that, when executed by the processor, cause the processor to:
receive the curve function defining at least the portion of the object surface;
receive a specification of a predetermined number of points;
automatically parameterize the curve function to a single variable;
automatically convolve a derivative of the curve function to obtain a first convolution;
automatically convolve the first convolution to obtain a second convolution;
automatically indicate a predetermined number of points of the second convolution having maximal values; and
output the indicated predetermined number of points.

20. The surface analysis system of claim 19, wherein the curve function is a single curve function derived from two or more boundaries extracted from adjacent pieces of the object surface.

* * * * *

UNITED STATES PATENT AND TRADEMARK OFFICE
CERTIFICATE OF CORRECTION

| | | |
|---|---|---|
| PATENT NO. | : 12,340,218 B2 | Page 1 of 1 |
| APPLICATION NO. | : 18/313221 | |
| DATED | : June 24, 2025 | |
| INVENTOR(S) | : Paul Zack Thunemann, Thomas Allen Hogan-Schmidt and Jeffrey David Poskin | |

It is certified that error appears in the above-identified patent and that said Letters Patent is hereby corrected as shown below:

In the Specification

In Column 5, Line 37 delete "$f{:}{\mapsto}$" and insert --$f: t \mapsto \Re^3$--

In Column 5, Line 39 delete "$c{:}{\mapsto} \Re^3$" and insert --$c: \sigma \mapsto \Re^3$--

Signed and Sealed this
Thirtieth Day of December, 2025

John A. Squires
*Director of the United States Patent and Trademark Office*